United States Patent

Szu et al.

[11] Patent Number: 6,116,922
[45] Date of Patent: Sep. 12, 2000

[54] ELECTRICAL CONNECTOR

[75] Inventors: Ming-Lun Szu, Taipei; Shih-Wei Hsiao, Kaohsiung, both of Taiwan

[73] Assignee: Hon Hai Precision Ind. Co., Ltd., Taipei Hsien, Taiwan

[21] Appl. No.: 09/302,696

[22] Filed: Apr. 30, 1999

[30] Foreign Application Priority Data

Feb. 2, 1999 [TW] Taiwan ................................. 88201713

[51] Int. Cl.7 .................................................. H01R 12/00
[52] U.S. Cl. .................................................. 439/83; 439/70
[58] Field of Search ................................. 439/83, 70, 71, 439/876; 174/260; 257/738

[56] References Cited

U.S. PATENT DOCUMENTS

| | | | |
|---|---|---|---|
| 4,682,892 | 7/1987 | Kunkle et al. | 439/83 |
| 5,598,036 | 1/1997 | Ho | 257/738 |
| 5,876,219 | 3/1999 | Taylor et al. | 439/74 |
| 5,975,921 | 11/1999 | Shuey | 439/83 |

FOREIGN PATENT DOCUMENTS 4-314355  11/1992  Japan ............................. H01L 23/12

*Primary Examiner*—Tnrsidan C Patel
*Attorney, Agent, or Firm*—Wei Te Chung

[57] ABSTRACT

An electrical connector includes an insulative housing defining a plurality of cavities therein, a number of contacts and an arrangement for strengthening the engagement of the connector to a circuit board. The strengthening arrangement includes a number of holes disposed along an outer periphery of the cavities and a number of terminals received in the holes. Each of the contact and the terminal has a mating portion and a mounting portion. The mounting portions of the contacts and the terminals are connected to the contact pads of the circuit board by solder balls. A stress exists when the contacts and terminals are soldered to the contact pads on the circuit board, but the stress acting on the contacts is relieved by the terminals sharing a lot of the stress. Thus, the contacts are secured on the contact pads.

9 Claims, 4 Drawing Sheets

ELECTRICAL CONNECTOR

BACKGROUND OF THE INVENTION

The present invention relates to an electrical connector, and especially to a ball grid array (BGA) socket which can effectively resist stress occurred due to different thermal expansion between insulative housing of the BGA socket and a printed circuit board to which the socket is mounted.

U.S. Pat. Nos. 5,593,322; 5,702,255; and 5,716,222 each disclose an electrical connector which comprises a housing and a plurality of contacts. The contacts of the electrical connector are soldered to contact pads of a circuit board by solder balls. The solder balls disposed at the ends of the contacts melt as they are heated and solidify upon cooling for connecting the contact pads and the contacts. During this process, the housing and the circuit board expand and contract, and a relative movement occurs therebetween because the housing and the circuit board each have a different coefficient of thermal expansion (CTE). Thus, a stress exists between the contacts, the solder balls and the contact pads, and the biggest stress exists between the elements distant from a center of the housing. The stress fully acts on the contacts such that the contacts, especially the contacts distant from the center of the housing, may become inadvertently separated from the contact pads on the circuit board thereby disrupting signal transmission. Hence, an improved electrical connector is required to overcome the disadvantages of the prior art.

BRIEF SUMMARY OF THE INVENTION

An object of the present invention is to provide an electrical connector having means of dealing with coefficient of thermal expansion (CTE) problems whereby the connector maintains excellent electrical characteristics even subjecting to a temperature change.

Accordingly, an electrical connector includes an insulative housing, a plurality of contacts and means for reducing a stress between the contacts and contact pads of a circuit board that the connector is mounted on. The stress is formed between the housing and the circuit board each being made of materials having a different CTE and experiencing a temperature change. The housing has a mating surface and a mounting surface on opposite faces thereof, and a number of cavities defined between the mating and mounting surfaces. A recessed surface is disposed in the housing along outer edges of the mounting surface.

The means for reducing stress includes a number of holes disposed in predetermined positions of the recessed surface and terminals received in the holes. Each contact and terminal has a mating portion and a mounting portion, and the mounting portion is bent substantially 90 degrees to form a mounting face. The mounting faces of the contacts and terminals are connected to the contact pads of the circuit board by solder balls and the terminals share a lot of the stress caused by the different CTE of the housing and the circuit board. The mounting faces of the terminals are larger than the mounting faces of the contacts, and the solder balls and contact pads for connecting the terminals are correspondingly larger than the solder balls and contact pads for connecting the contacts, so, the terminals are secured on the contact pads.

In accordance with another aspect of the present invention, the means for reducing stress includes a number of securing pads disposed at predetermined positions of the recessed surface which replace the terminals and holes of the first embodiment and be connected to the pads of the circuit board by solder balls to share the stress caused by the different CTE of the housing and the circuit board.

Other objects, advantages and novel features of the invention will become more apparent from the following detailed description of the present embodiment when taken in conjunction with the accompanying drawings.

DETAILED DESCRIPTION OF THE INVENTION

Figure 1:
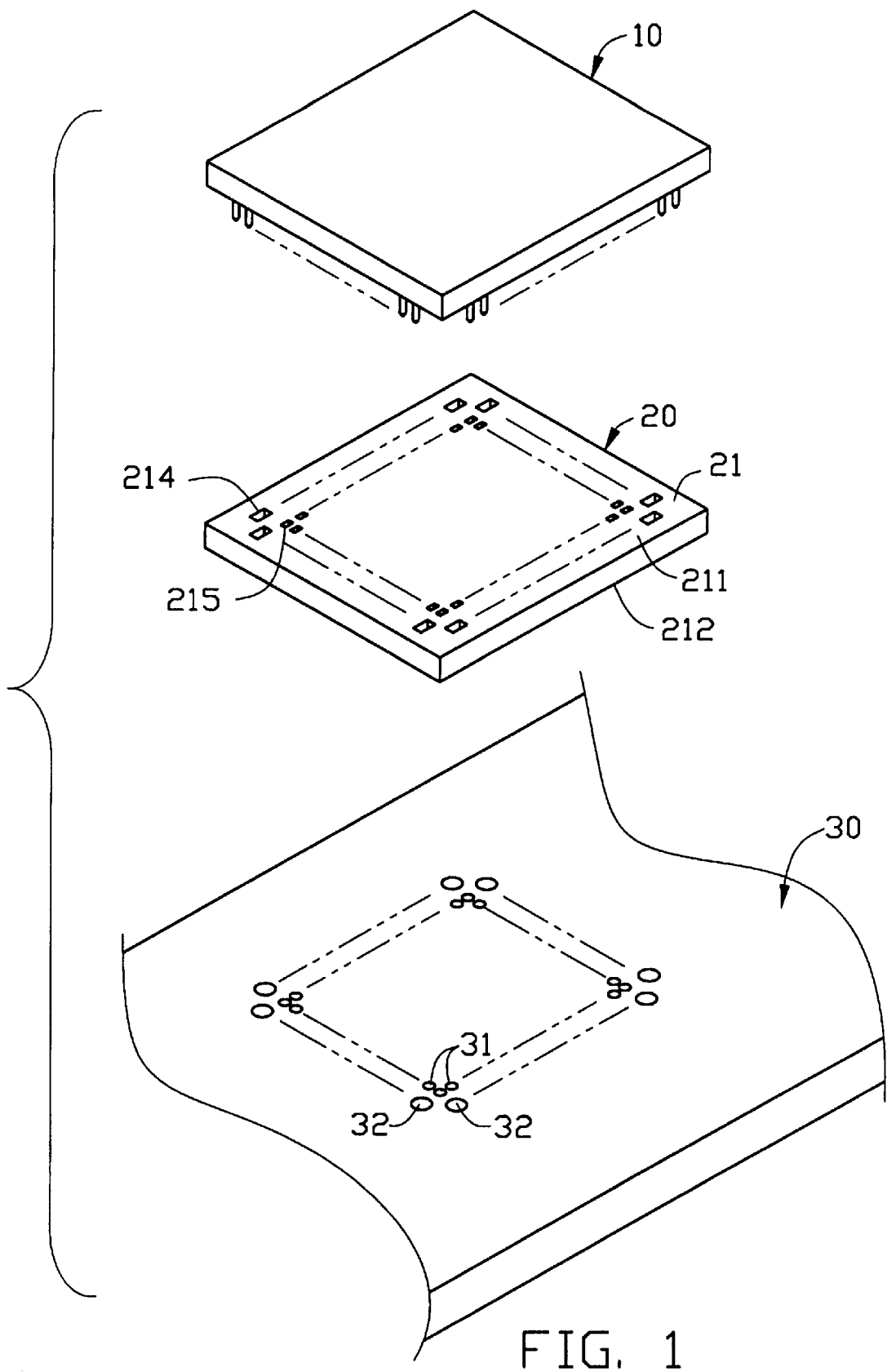
FIG. 1 is an exploded view of the connector of the present invention, a central processing unit (CPU) and a circuit board.
Figure 2:
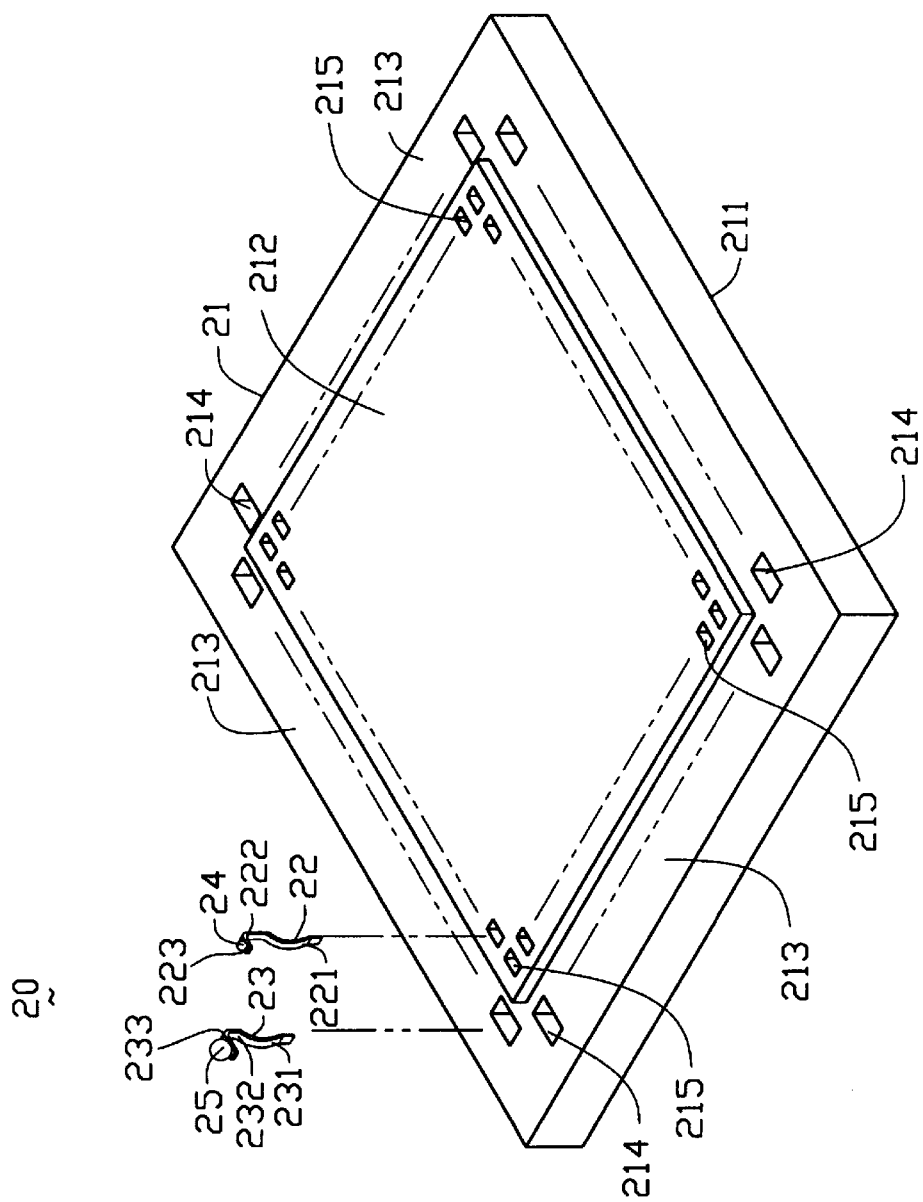
FIG. 2 is a bottom perspective view of the connector of the present invention with contacts removed from a housing thereof.

Referring to FIGS. 1 and 2, an electrical connector 20 of the present invention engages a CPU 10 and a circuit board 30 for transferring electrical signal therebetween. The connector 20 includes an insulative housing 21, a plurality of contacts 22 and a number of terminals 23. The housing 21 has a mating surface 211 and a mounting surface 212 on opposite sides thereof. A recessed surface 213 is formed in the housing 21 along outer edges of the mounting surface 212. A number of holes 214 are defined through the mating surfaces 211 and the recessed surface 213 for receiving the terminals 23 therein.

Each contact 22 has a first mating portion 221 and a first mounting portion 222. Each terminal 23 has a second mating portion 231 and a second mounting portion 232. Each of the first and second mounting portions 222, 232 is vertically bent to form a first mounting face 223 and a second mounting face 233 at an end thereof, respectively. The second mounting face 233 is larger than the first mounting face 223. In assembly, the contacts 22 and the terminals 23 are respectively inserted into the cavities 215 and the holes 214 whereby the mounting faces 223, 233 are flush with the mounting surface 212 and the recessed surface 213, respectively. The circuit board 30 forms first contact pads 31 and second contact pads 32 corresponding to the contacts 22 and the terminals 23, respectively. The second contact pads 32 are larger than the first contact pads 31.

Figure 3:
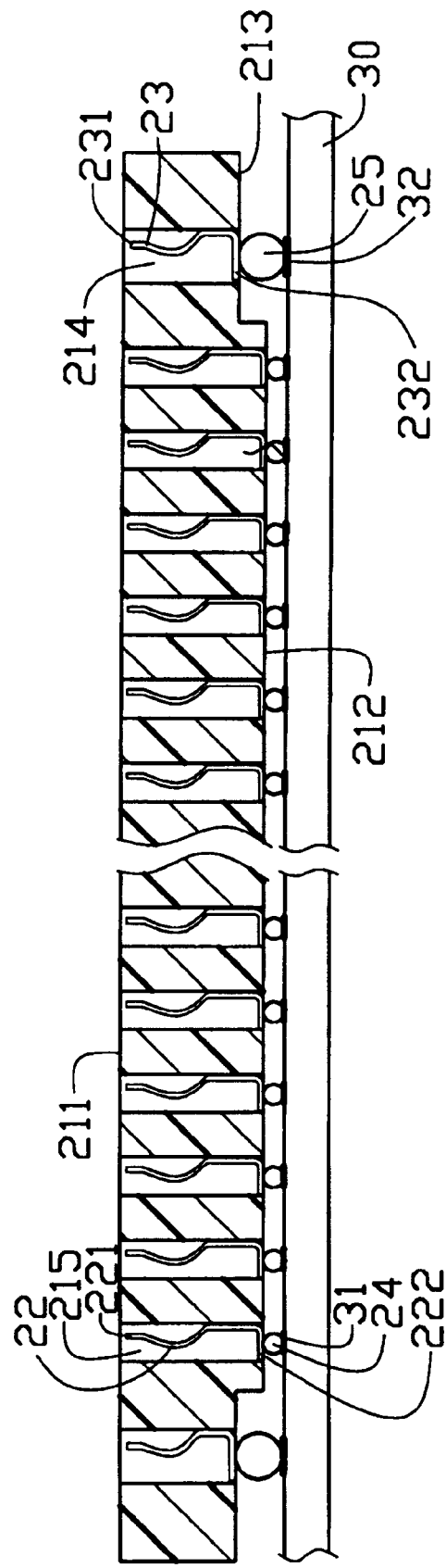
FIG. 3 is a cross-sectional view of the connector of the present invention engaged with the circuit board.

Referring to FIG. 3, when the connector 20 is engaged with the circuit board 30, a small solder ball 24 and a big solder ball 25 are respectively positioned between each mounting face 223, 233 and each contact pad 31, 32. The solder balls 24, 25 melt as they are heated and solidify upon cooling whereby the first contact pads 31 connect with the contacts 22 and the second contact pads 32 connect with the terminals 23. During the process, the housing 11 and the circuit board 30 expand and contract, and a relative movement occurs therebetween because the housing 11 and the circuit board 30 each have a different coefficient of thermal expansion (CTE). Thus, a stress exists between the mounting faces 223 (233), the solder balls 24 (25) and the contact pads 31 (32), and the biggest stress exists between elements distanced from a center of the housing 11. The biggest stress exists between the second faces 232, the big solder balls 25, and the second contact pads 32. The terminals 23 share a lot of the stress, thus the stress of the contacts 22 is much lower than the stress of the connectors of the prior art. Nonetheless, the connection between the terminals 22, the big solder balls 25 and the second contact pads 32 is prevented from damage because of the larger contacting area therebetween. Thus, the connector 20 is securely engaged with the circuit board 30, and the problems encountered in the conventional connectors are overcome.

Figure 4:
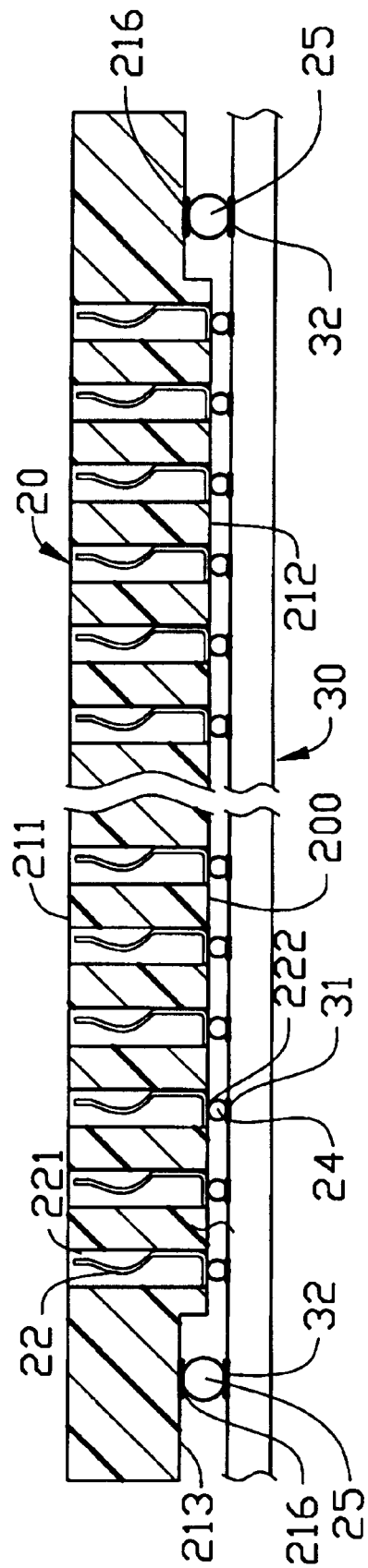
FIG. 4 is a cross-sectional view of an alternate embodiment of the connector of the present invention engaged with the circuit board.

Referring to FIG. 4, an alternate embodiment of the present invention is shown. A number of securing pads 216 replace the holes 214 and the terminals 23 for connecting with the big solder balls 25 and the second contact pads 32 of the circuit board 30. The securing pads 216 are larger than the first contact pads 31; thus, the connection between the big solder balls 25, the second contact pads 32 and the securing pads 216 is secure.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for engaging an electrical device and a circuit board having a plurality of contact pads thereon for transferring electrical signals therebetween, the connector comprising:

an insulative housing having a mating surface and a mounting surface on opposite faces thereof and a plurality of cavities between the mating surface and the mounting surface, the housing defining a recessed surface recessing from the mounting surface toward the mating surface along outermost edges of the mounting surface;

a plurality of contacts received in the cavities of the housing, each contact having a mating portion adapted for engaging with the electrical device and a mounting portion solderably engaging with the contact pad of the circuit board via a first solder ball below the mounting portion; and means for relieving stress caused between the mounting portions of the contacts and the contact pads of the circuit board due to the housing and the circuit board each having a different coefficient of thermal expansion after a change of temperature, said stress relieving means comprising a plurality of second solder balls, each of said second solder balls being larger than the first solder ball, the second solder balls being located on the recessed surface of the housing so that the first and the second solder balls may be coplanarly mounted on the circuit board.

2. The electrical connector as claimed in claim 1, wherein the stress relieving means includes a plurality of holes defined in the recessed surface of the housing and a corresponding number of terminals retained in the holes, each terminal comprising a mounting portion having a mounting face generally flushing with the recessed surface.

3. The electrical connector as claimed in claim 2, wherein the mounting portion of the terminal is larger than the mounting portion of the contact.

4. The electrical connector as claimed in claim 1, wherein the stress relieving means comprises a plurality of securing pads positioned on the recessed surface of the housing and the securing pads are solderably engaged to corresponding contact pads of the circuit board by the second solder balls.

5. The electrical connector as claimed in claim 4, wherein the area of the securing pad is larger than the area of the contact pad for connecting the contacts.

6. An electrical connector comprising:

an insulative housing having a mating surface and a mounting surface on opposite faces thereof and a plurality of cavities between the mating surface and the mounting surface;

a plurality of contacts received within the corresponding cavities, respectively, each of said contacts including a mating portion adapted to be matingly engaged with an electrical device thereabove and a mounting portion adapted to be solderably engaged to a circuit board through a relatively smaller solder ball thereunder;

terminals retained in the housing and being adjacent to outermost portions of the housing; and relatively larger solder balls provided adjacent to the outermost portions of the housing and connected to the terminals for relieving stress, wherein top portions of the larger solder balls extend beyond the mounting surface toward the mating surface of the housing such that bottom portions of the larger solder balls are coplanar with those of the smaller solder balls.

7. The connector as claimed in claim 6, wherein a recess surface is provided on the housing along outer edges of the mounting surface for receipt of said relatively larger solder balls thereabouts.

8. The connector as claimed in claim 6, wherein the terminals are bigger than the contacts.

9. An electrical assembly comprising:

an insulative housing having a mating surface and a mounting surface on opposite faces thereof and a plurality of cavities between the mating surface and the mounting surface;

a plurality of contacts received within the corresponding cavities, each of said contacts including a mounting portion with only one first solder ball thereunder; and a circuit board positioned under the housing and including a plurality of first contact pads for soldering to the corresponding first solder balls;

the circuit board further including a plurality of second contact pads relatively larger than the first contact pads to have thereon a plurality of second solder balls soldered diametrically larger than the first solder balls, wherein said second solder balls are positioned adjacent to outermost portions of the housing surrounding the first solder balls.

* * * * *